United States Patent [19]
Grant et al.

[11] Patent Number: 5,971,595
[45] Date of Patent: Oct. 26, 1999

[54] METHOD FOR LINKING A HARDWARE DESCRIPTION TO AN IC LAYOUT

[75] Inventors: Douglas M. Grant, Edinburgh; John P. Gray, East Lothian, both of United Kingdom

[73] Assignee: Xilinx, Inc., San Jose, Calif.

[21] Appl. No.: 08/840,341

[22] Filed: Apr. 28, 1997

[51] Int. Cl.$^6$ ................................................. G06F 17/50
[52] U.S. Cl. .................................... 364/488; 364/489
[58] Field of Search .................................. 364/488, 489, 364/490, 491, 578

[56] References Cited

U.S. PATENT DOCUMENTS

| | | | |
|---|---|---|---|
| 5,469,003 | 11/1995 | Kean ........................................... | 326/39 |
| 5,724,250 | 3/1998 | Kerzman et al. ........................ | 364/488 |
| 5,726,903 | 3/1998 | Kerzman et al. ........................ | 364/489 |
| 5,805,861 | 9/1998 | Gilbert et al. ........................... | 395/500 |
| 5,850,348 | 12/1998 | Berman .................................... | 364/488 |

OTHER PUBLICATIONS

Xilinx, Inc., "The Programmable Logic Data Book," 1996, available Xilinx, Inc., 2100 Logic Drive, San Jose, California 95124. no pg #s.

Synopsys, Inc., DesignWare Technical Bulletin, Jan. 1996. no pg #s.

Synopsys, Inc., DesignWare Technical Bulletin, Apr. 1996. no pg #s.

Synopsys, Inc., DesignWare Technical Bulletin, Jul. 1996. no pg #s.

Synopsys, Inc., DesignWare Technical Bulletin, Oct. 1996. no pg #s.

Synopsys, Inc., DesignWare Technical Bulletin, Jan. 1997. no pg #s.

*Primary Examiner*—Kevin J. Teska
*Assistant Examiner*—Leigh Marie Garbowski
*Attorney, Agent, or Firm*—Edel M. Young

[57] ABSTRACT

A method and system for converting a hardware description language file which includes parameterized attributes into a product specification with hardware properties generated based on the parameters used to create/instantiate cells defined by the hardware description language file. The hardware properties are used by design tools to perform such functions as pre-place cells, route cells, and control the configuration of cells.

19 Claims, 11 Drawing Sheets

```
-- (C) 1995,1996 Xilinx Inc. All Rights Reserved
-- serial multiplier slice, serial multiplier and input shift register
--
------------------------------
-- Interface declaration:
------------------------------
LIBRARY IEEE;
USE IEEE.std_logic_1164.all;
USE WORK.fircoeffs.all; -- For FIR coefficients
USE WORK.fir_xtras.all; -- For xtra bits
LIBRARY PRIMS; - Primitives
USE PRIMS.all;
Library XACT:
USE XACT.XACT6000_attributes_simple.ALL; -- For attributes ENTITY srmll IS
   GENERIC (n : INTEGER;      -- data size
           n_taps : INTEGER;  -- Number of taps in design
           coeff : INTEGER);  -- The coefficient
   PORT (din,clk,clra,clrb,bufselbar: IN std_logic;
        dout: OUT std_logic; addin : in std_logic;
        sumout : out std_logic; bufselbardel : out std_logic);

-- Attributes for place and route control
attribute bbox of srmll : entity is "WIDE";
attribute rtmax of srmll : entity is "X1Y1";

END srmll;
------------------------------
-- Architecture body:
------------------------------
ARCHITECTURE structural OF srmll IS COMPONENT mult GENERIC(n_bits : INTEGER; coeff : INTEGER);
             PORT (addcon,bufselbar,clk,clra,clrb : IN std_logic;
                   bufout : OUT std_logic; feedbackin : in std_logic;
                   feedbackout : out std_logic);
      END COMPONENT;

COMPONENT seradd
                PORT (a,b,clk,clrall : IN std_logic; sum : OUT std_logic);
      END COMPONENT;

COMPONENT fdc
                PORT (d,c,clr : IN std_logic; q : OUT std_logic);
      END COMPONENT;

COMPONENT fdcp
                GENERIC (place : INTEGER; n_bits : INTEGER);
                PORT (d,c,clr : IN std_logic; q : OUT std_logic);
      END COMPONENT;

SIGNAL bout: std_logic;
SIGNAL z : std_logic_VECTOR(0 TO n+xtrabitsc(n_taps)+1);
```

300　　　　　　　　　　　　　　　　　FIG. 3A

```
    -- z is signals between shift register ff's
  SIGNAL feedback1, feedback2 : std_logic;

-- Attributes for place and route control
attribute rloc of mu1 : label is "X1Y1";
attribute rloc of add : label is "X4Y,n+1,";
attribute rloc of bdel : label is "X5Y,n+1,";
attribute flatten of gi : label is "";

BEGIN mu1 : mult GENERIC MAP (n_bits -> n, coeff => coeff)
              PORT MAP (addcon => z(n + xtrabitsc(n_taps)),
                        bufselbar => bufselbar, clk => clk, clra => clra,
                        clrb => clrb, bufout => bout, feedbackin => feedback2,
                        feedbackout => feedback1);

add : seradd PORT MAP (a => addin, b => bout, clk => clk,
                               clrall => clra, sum => sumout);

z(0) <= din;
        dout <= z(n + xtrabitsc (n_taps) + 1);

gi : FOR i IN 0 TO (n + xtrabitsc(n_taps)) GENERATE
             ff : fdcp GENERIC MAP(place => i, n_bits => n)
                  PORT MAP (d => z(1), c => clk, clr => clrb, q => z(i+1));
        END GENERATE;

bdel : fdc PORT MAP (d => bufselbar, c => clk, clr => clrb, q => bufselbardel);
        feedback2 <= feedback1;

END structural;

CONFIGURATION cfg_srm11_str OF srm11 IS
        FOR structural
        END FOR;
END cfg_srm11_str;
```

```
-- (C) 1995, 1996 Xilinx, Inc. All Rights Reserved

-- serial multiplier slice with placement info.
-- serial multiplier
   and input shift register
--
-------------------
-- Interface declaration:
-------------------
LIBRARY IEEE;
USE IEEE.std_logic_1164.all;
USE WORK.fir_coeffs.all; -- For FIR coefficients
USE WORK.fir_xtras.all; -- For xtra bits
LIBRARY PRIMS; -- Primitives
USE PRIMS.all;
Library XACT;
USE XACT.XACT6000_attributes_simple.ALL;   -- For attributes ENTITY smllp IS
    GENERIC(n : INTEGER:           -- data size
            n_taps:INTEGER;        -- Number of taps in design
            coeff:INTEGER;         -- The coeff
            p:INTEGER);            -- To aid placement
    PORT(din,clk,clra,clrb,bufselbar:IN std_logic;
            dout:OUT std_logic; addin : in std_logic;
            sumout : out std_logic; bufselbardel : out std_logic);

-- Attributes for place and route control
END smllp;
-------------------
-- Architecture body:
-------------------
ARCHITECTURE structural OF smllp IS COMPONENT smll
                GENERIC (n : INTEGER; n_taps : INTEGER; coeff : INTEGER);
                PORT(din,clk,clra,clrb,bufselbar : IN std_logic;
                        dout: OUT std_logic; addin : in std_logic;
                        sumout : out std_logic; bufselbardel : out std_logic);
        END COMPONENT;
```

```
-- Attributes for place and route control
-- On a 6216, with 64 by 64 cells ...
-- There can be 3 rows of 10 taps and one of 9 if n_bits < 11
--       1 row of 10 taps and one of 9 if n_bits < 27
--       1 row of 9 taps if n_bits < 58
--       1st row      2nd row      3rd row          4th row      just in case!
--       1st row      2nd row      Watch out for controller!
--       3rd row      4th row      J.I.C!

attribute rloc of srml : label is "X,(p<11?6*(p-1):(p<21?(63-(6*(p-
10))):(p<31?(6*(p-21)):(p<40?(63-(6*(p-30))):0)))),
Y,(p<11?0:(p<20?(n<11?16:(n<27?32:0)):(p<21?(n<11?16:0):
(p<31?(n<11?32:0):(p<40?(n<11?48:0):0))))),";

BEGIN
    srml : srmll GENERIC MAP (n -> n, n_taps => n_taps, coeff => coeff)
        PORT MAP (din => din, clk => clk,
                    clra => clra, clrb => clrb, bufselbar => bufselbar,
                    dout => dout, addin => addin, sumout -> sumout,
                    bufselbardel => bufselbardel);
END structural;

CONFIGURATION cfg_srm11p_str OF srm11p I3
    FOR structural
    END FOR;
END cfg_srm11p_str;
```

```
---
--- Common text in normal typeface.
--- Text specific to post-conversion in bold
---
(cell srmll_n8_n_taps5_coeff33 (cellType GENERIC)
(property RTMAX (string "X1Y1") (owner "XACT6000"))
(property BBOX (string "WIDE") (owner "XACT6000"))
    (view Netlist_representation (viewType NETLIST)
      (interface (port din (direction INPUT)) (port clk (direction INPUT))
        (port clra (direction INPUT)) (port clrb (direction INPUT))
        (port bufselbar (direction INPUT)) (port dout (direction OUTPUT))
        (port addin (direction INPUT)) (port sumout (direction OUTPUT))
        (port bufselbardel (direction OUTPUT))
    )
    (contents
       ( instance add
            (viewRef Netlist_representation (cellRef seradd))
            (property RLOC (string "X4Y9")
              (owner "XACT6000"))
       )

( instance bdel
            (viewRef Netlist_representation (cellRef FDC (libraryRef xc6000)))
            (property RLOC (string "X5Y9") (owner "XACT6000"))
       )

( instance ff
            (viewRef Netlist_representation (cellRef fdcp_place0_n_bits0))
            (property FLATTEN (string "") (owner "XACT6000"))
       )
       --- instances ff_1 through ff_10
       ( instance ff_11
            (viewRef Netlist_representation (cellRef fdcp_placell_n_bits8))
            (property FLATTEN (string "") (owner "XACT6000"))
       )

( instance mul
            (viewRef Netlist_representation (cellRef mult_n_bits8_coeff33))
            (property RLOC (string "X1Y1") (owner "XACT6000"))
       )
       --- net connections for signals "addin", "clk", "sumout", "z_1_"
       --- through "z_11_", "bufselbardel", "bufselbar", "feedback1",
       --- "bout", "clra", "din", and "clrb",
    )
  )
)
```

```
---
---  Placement (p=3) for an instance of the generic 5-tap, 33 coefficient srml,
---  disclosed above, now that attributes have been added (cell srmll_n8_n_taps5_coeff33_p3 (cellType GENERIC)
  (view Netlist_representation (viewType NETLIST)
    (interface (port din (direction INPUT)) (port clk (direction INPUT))
     (port clra (direction INPUT))  (port clrb  (direction INPUT))
     (port bufselbar (direction INPUT)) (port dout (direction OUTPUT))
     (port addin (direction INPUT)) (port sumout (direction OUTPUT))
     (port bufselbardel (direction OUTPUT))
   )
   (contents
      ( instance srml
          (viewRef Netlist_representation (cellRef
          srm11_n8_n_taps5_coeff33))
          (property RLOC (string "X12Y0") (owner "XACT6000"))
      )

---  net connections for signals "din", "clk", "bufselbardel"
     ---  "bufselbar", "feedback1", "sumout", "clra", "dout",
     ---  "addin" and "clrb"
   )
  )
 )
)
```

```
--- 
--- SRML - 5 taps, 44 coefficients, no tap placement information
(Cell srmll_n8_n_taps5_coeff44 (cellType GENERIC)
 (property RTMAX (string "X1Y1") (owner "XACT6000"))
 (property BBOX (string "WIDE") (owner "XACT6000"))
 (view Netlist_representation (viewType NETLIST)
     (interface (port din (direction INPUT)) (port clk (direction INPUT))
      (port clra (direction INPUT)) (port clrb (direction INPUT))
      (port bufselbar (direction INPUT)) (port dout (direction OUTPUT))
      (port addin (direction INPUT)) (port sumout (direction OUTPUT))
      (port bufselbardel (direction OUTPUT))
     )
   (contents
      ( instance add
            (viewRef Netlist_representation (cellRef seradd))
            (property RLOC (string "X4Y9") (owner "XACT6000"))
      )

( instance bdel
            (viewRef Netlist_representation (cellRef FDC (libraryRef xc6000)))
            (property RLOC (string "X5Y9") (owner "XACT6000"))
      )

( instance ff
            (viewRef Netlist_representation (cellRef fdcp_place0_n_bits8))
            (property FLATTEN (string "") (owner "XACT6000"))
      )
      --- instances ff_1 through ff_10
      ( instance ff_11
            (viewRef Netlist_representation (cellRef fdcp_place11_n_bits8))
            (property FLATTEN (string "") (owner "XACT6000"))
      )

( instance mul
            (viewRef Netlist_representation (cellRef mult_n_bits8_coeff44))
            (property RLOC (string "X1Y1") (owner "XACT6000"))
      )
      --- net connections for signals "addin", "clk", "sumout", "z_1_"
      --- through "z_11_", "bufselbardel", "bufselbar", "feedback1",
      --- "bout", "clra", "din", and "clrb",
   )
  )
)
```

```
---
---    SRML with a tap at position (p=4) for a generic 5-tap,
---    44 coefficient srml defined above
---

(Cell srmllp_n8_n_taps5_coeff44_p4 (cellType GENERIC)
    (view Netlist_representation (viewType NETLIST)
      (interface (port din (direction INPUT)) (port clk (direction INPUT))
        (port clra (direction INPUT)) (port clrb (direction INPUT))
        (port bufselbar (direction INPUT)) (port dout (direction OUTPUT))
        (port addin (direction INPUT)) (port sumout (direction OUTPUT))
        (port bufselbardel (direction OUTPUT))
      )
      (contents
        ( instance srml
            (viewRef Netlist_representation (cellRef srm11_n8_n_taps5_coeff44))
            (property RLOC (string "X18Y0") (owner "XACT6000"))
        )
        --- net connections for signals: "din", "clk", "bufselbar"
        ---"sumout", "bufselbardel", "clra", "dout", "addin" and
        --- "clrb"
      )
    )
  )
```

515

FIG. 5D

METHOD FOR LINKING A HARDWARE DESCRIPTION TO AN IC LAYOUT

TECHNICAL FIELD

The present invention relates to the field of hardware description programming languages and the conversion of designs from a hardware description to an integrated circuit layout.

BACKGROUND OF THE INVENTION

Xilinx, Inc. the assignee of the present application, manufactures logic devices. Although some devices are mask programmable, many devices manufactured by Xilinx are field programmable logic devices. A programmable logic device is an integrated circuit chip which includes a plurality of programmable input/output pads, a plurality of configurable logic elements, and a programmable interconnect for interconnecting the plurality of logic elements. Further, each logic element includes a logic block which implements a logic function of the n inputs to the logic block according to how the logic element has been configured. Logic functions may use all n inputs to the logic block or may use only a subset thereof. A few of the possible logic functions that a logic element can be configured to implement are: AND, OR, XOR, NAND, NOR, NXOR and mixed combinations of these functions. The implementation and operation of logic devices made by Xilinx are described in "The Programmable Logic Data Book," pages 4-1 to 4-372, copyright 1996 by Xilinx, available from Xilinx, Inc., 2100 Logic Drive, San Jose, Calif. 95124. The contents of "The Programmable Logic Data Book" are incorporated herein by reference.

As the density of logic devices increases, the complexity of possible designs that can be incorporated into a single device increases. By reusing existing designs from previous projects, designers are freed from having to "recreate the wheel", and are better able to concentrate on the new aspects of their designs. Designers have created libraries of designs which represent previously tested designs, but these known libraries were not automatically extendable to designs using a larger number of bits or designs with slightly different parameters. For example, known libraries included designs for each bit size of a particular type of component, e.g., adders from a single-bit adder to a thirty-two-bit adder. By including each of these designs separately, library sizes grew quickly. In static library configurations, despite the large library sizes, extending a library is awkward and involves using a library component along with design specific logic to create a custom piece, e.g., combining a single-bit adder with a thirty-two-bit adder to create a thirty-three-bit adder. This restrictive design methodology which creates large libraries and semi-rigid designs is not easily adaptable to an increasingly dynamic design schedule which requires faster turn-around times for designs. Likewise, libraries which include statically pre-routed components are not adaptable to changes in architecture or to a variation in shape of the unused components of an architecture.

To help decrease design time, designers have turned to two important technologies: 1) programmable gate arrays and 2) hardware description languages. Gone are the days of hardwired discrete components being used to implement circuits for printed circuit board-level designs. Designers now use compact, highly integrated, VLSI chips to conserve board space and system power. However, fabricating an ASIC also requires an increase in lead time to fabricate and test the ASIC to be used in a design. Xilinx sells a family of field programmable gate arrays (FPGAs) that can be quickly programmed and reprogrammed by a designer to implement a particular logic function. Using FPGA-based boards, changes can be made to a design by simply reprogramming the appropriate FPGA, without even removing the FPGA from its socket. This technique reduces design time.

The use of hardware description languages also reduces design time. Although schematic capture was previously used to develop designs, hardware description languages such as VHDL are now capable of generating designs from logical descriptions of the functions which are to be performed by the circuit being built. It is believed that this more generalized and higher level approach allows designs to be created more compactly and to be analyzed more quickly. A hardware description language is then compiled like a high-level programming language to produce a design file which implements the specifics of the design. This design file is either an intermediate design file which is architecture independent, or it is a product specific design file, e.g., a design file specific to a gate array architecture or a FPGA architecture. When generating a product specific design file, the design compiler determines routes between independent units in the design, and as the number of independently routed units increases, so does the time required to generate a new or modified design. Synopsys, Inc. of 700 East Middlefield Rd. in Mountain View, Calif., provides a suite of tools which support hardware description languages. Tools produced by Synopsys, Inc. include DesignWare and FPGA Express. Details on DesignWare can be found in the January 1996, April 1996, July 1996 and October 1996 editions of the DesignWare Technical Bulletin. The contents of each of these Technical bulletins is incorporated herein by reference. However, a significant limitation of DesignWare is that it does not support user-specific, parameterized attributes which can be converted to properties of instances of components.

SUMMARY OF THE INVENTION

Accordingly, the present invention beneficially overcomes at least one of the above-identified deficiencies in known systems. The present invention provides an improved method and system for linking a hardware description to an integrated circuit layout.

Briefly, the preferred embodiment of the present invention is a method for operating a microprocessor, where the method ultimately is embodied in code for controlling the microprocessor when the code is executed by the microprocessor. The inventive method utilizes parameterized attributes in a hardware description language, a language compiler, and a post-processor for processing the output of the language compiler.

According to the present invention, a hardware design system is made more efficient and feature-rich by utilizing parameterized attributes to augment high-level descriptions of logic functions. The parameterized attributes control pre-placement of inter-related logic components, an order of routing, aligning and grouping constraints, and the relative positions of components to each other. The attributes also include interconnection constraints such as a maximum length for wires/buses which interconnect components and whether or not designs are to be compacted. When a component is generated from the library, parameters are specified which create a file representing an instance of the component, but the parameterized attributes are not added to the file. The file representing the instance is then post-processed to add properties to the file based on the attributes stored in the original hardware description of the library. The post-processed file can then be used by back-end tools to pre-place or route the components based on their respective properties.

Further, by implementing libraries of designs using the high-level, attribute-based descriptions used by the present invention, extendable libraries can be built which accommodate variable parameters, e.g., widths of adders.

BRIEF DESCRIPTION OF THE DRAWINGS

The above and further aspects of the present invention will become more clear to those skilled in the art in view of the best presently known mode of carrying out the invention and the industrial applicability of the preferred embodiment as described herein and as illustrated in the several figures, wherein:

FIGS. 3A to 3D are hardware description listings of components which are to be mapped onto the integrated circuit architecture of FIG. 2;

FIGS. 5A to 5D are portions of an EDIF generated from the hardware description listings of FIGS. 3A to 3D after the listings have been processed according to the method of the present invention.

DETAILED DESCRIPTION OF THE PREFERRED EMBODIMENT

Figure 1:
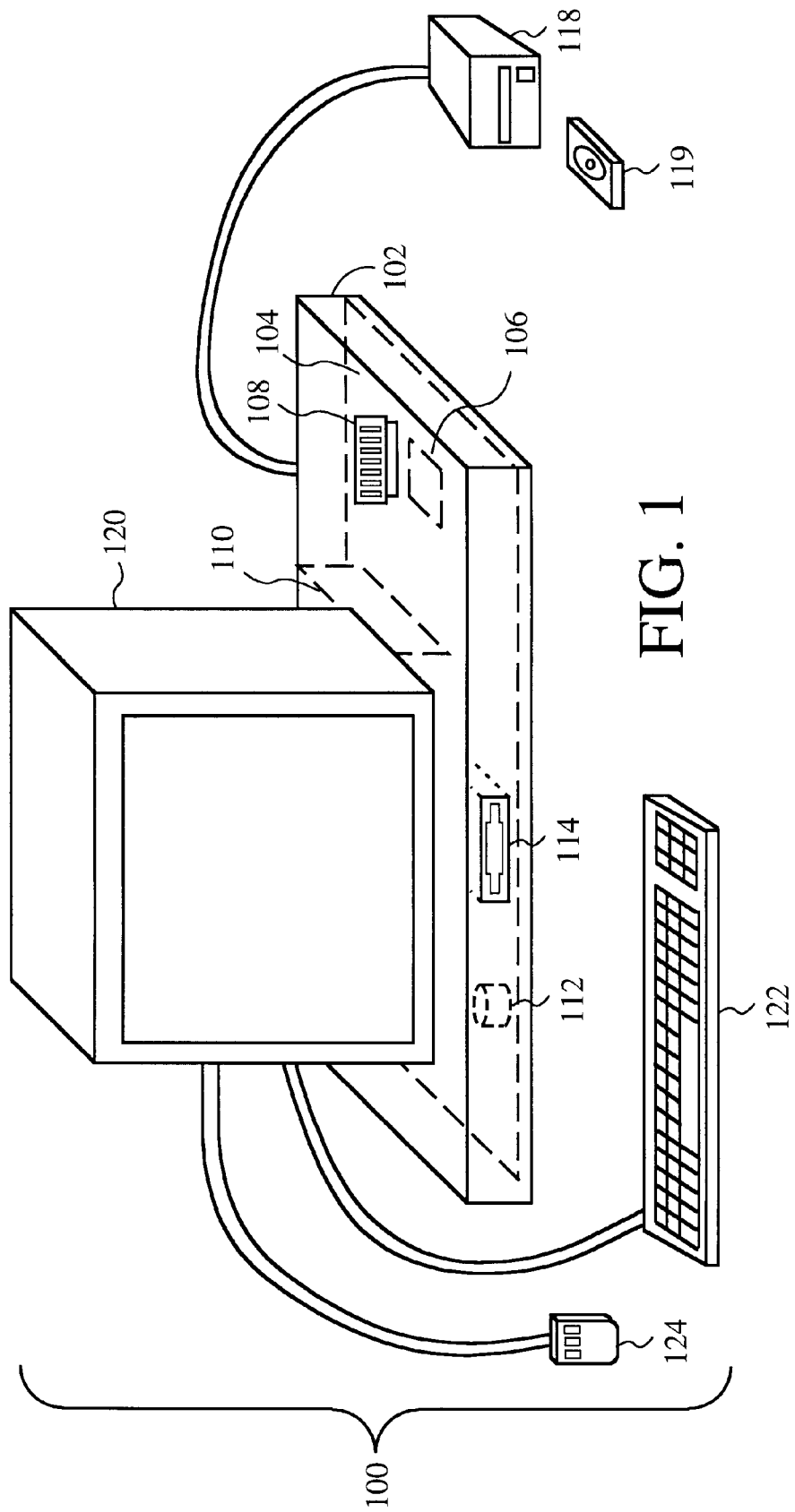
FIG. 1 is a schematic illustration of a computer system for performing the method of the present invention.

Referring now to the drawings, wherein like reference numerals designate identical or corresponding parts throughout the several views, FIG. 1 is a schematic illustration of a computer system for linking a hardware description to an integrated circuit layout. A computer 100 implements the method of the present invention, wherein the computer housing 102 houses a motherboard 104 which contains a CPU 106, memory 108 (e.g., DRAM, ROM, EPROM, EEPROM, SRAM and Flash RAM), and other optional special purpose logic devices (e.g., ASICs) or configurable logic devices (e.g., GAL and reprogrammable FPGA). The computer 100 also includes plural input devices, (e.g., a keyboard 122 and mouse 124), and a display card 110 for controlling monitor 120. In addition, the computer system 100 further includes a floppy disk drive 114; other removable media devices (e.g., compact disc 119, tape, and removable magneto-optical media (not shown)); and a hard disk 112, or other fixed, high density media drives, connected using an appropriate device bus (e.g., a SCSI bus or an Enhanced IDE bus). Also connected to the same device bus or another device bus, the computer 100 may additionally include a compact disc reader 118, a compact disc reader/writer unit (not shown) or a compact disc jukebox (not shown). Although compact disc 119 is shown in a CD caddy, the compact disc 119 can be inserted directly into CD-ROM drives which do not require caddies. In addition, a printer (not shown) also provides printed listings of processed design files. The computer 100 may also control a programmer to program an external device such as a programmable gate array. In some programmable gate array architectures, simply writing to a configuration memory in the programmable gate array is sufficient to program it.

As stated above, the system includes at least one computer readable medium. Examples of computer readable media are compact discs 119, hard disks 112, floppy disks, tape, magneto-optical disks, PROMs (EPROM, EEPROM, Flash EPROM), DRAM, SRAM, etc. Stored on any one or on a combination of the computer readable media, the present invention includes software for controlling both the hardware of the computer 100 and for enabling the computer 100 to interact with a human user. Such software may include, but is not limited to, device drivers, operating systems and user applications, such as development tools. Such computer readable media further includes the computer program product of the present invention for linking a hardware description to an integrated circuit layout.

Figure 2:
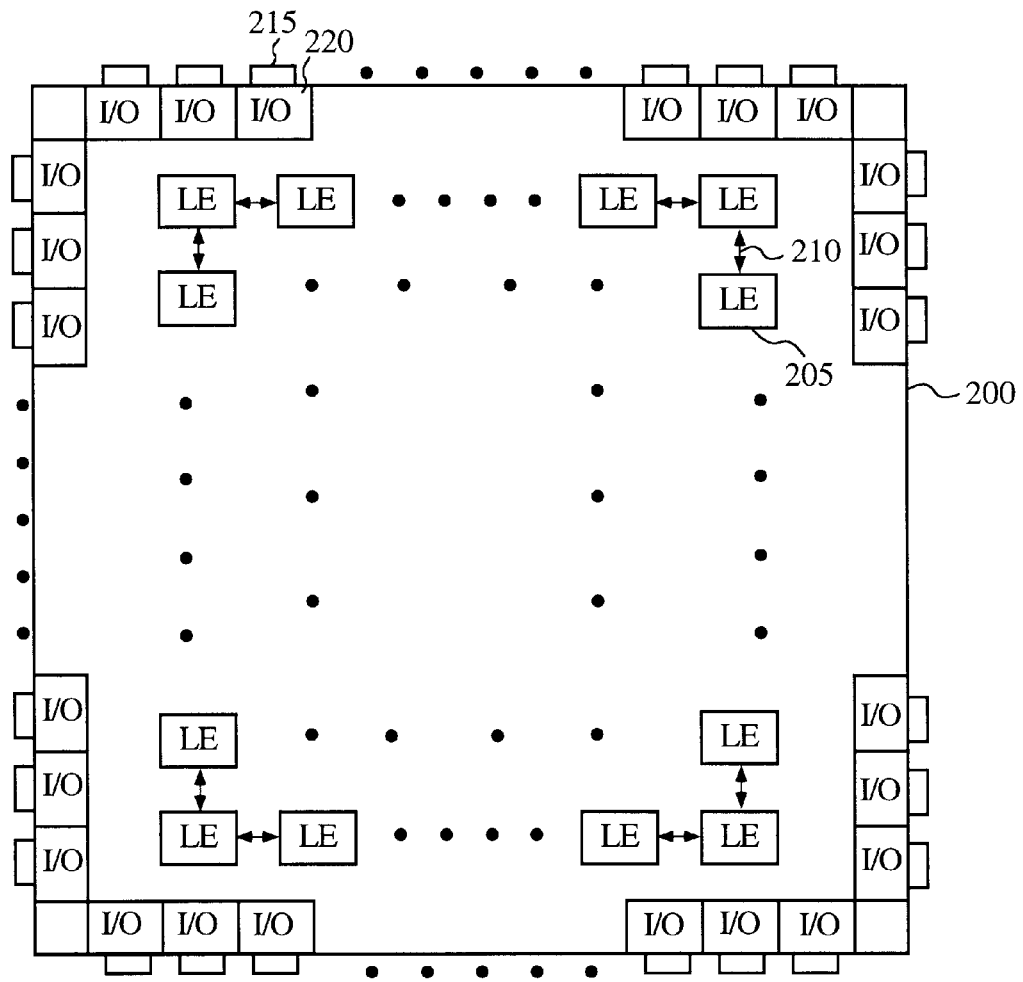
FIG. 2 is a schematic illustration of an exemplary integrated circuit architecture onto which a hardware description is mapped.

FIG. 2 shows an exemplary integrated circuit architecture 200 onto which a hardware description is to be mapped. For convenience and for illustrative purposes only, the description will be given in terms of the XC6200 Family architecture of FPGAs made by assignee, Xilinx, Inc. However, the same design process is applicable to ASICs using standardized cells, to PALs, to GALs, etc. In the Xilinx XC6216 device, there is a 64×64 hierarchical array of logic elements 205. The lowest-level of the hierarchical array includes individual logic elements 205 with bidirectional connections 210 to each neighboring logic unit. The bidirectional connection 210 in the XC6216 is a pair of uni-direction wires, but in an alternative embodiment, a single wire with bidirectional control is used. Groups of 4×4 logic element groups are arranged to form a second-level of the hierarchy, and 4 rows and 4 columns of the 4×4 logic element groups define the highest level of the hierarchy. The logic elements 205 are coupled to external pins 215 through configurable I/O controllers 220. Such a structure is further discussed by Kean in U.S. Pat. No. 5,469,003, incorporated herein by reference.

As an example of how a design can be mapped onto an architecture such as the architecture of FIG. 2, FIGS. 3A to 3D show a series of VHDL statements 300, 305, 310 and 315, respectively, from a library that describe part of an implementation of a finite impulse response (FIR) filter. Unlike known libraries, the embodiment shown in FIG. 3A is not specific to a particular data size, number of taps or coefficients. Rather, the implementation is described generally using variables to specify the data size, number of taps and coefficients. To support this general parameterized approach, the definition includes a library entitled "XACT" and uses attributes.

The definition of the "srmll" block of the FIR filter specifies two constant attributes to be used by the present invention when creating each "srmll" block. These attributes are "bbox" and "rtmax" which, respectively, control the aspect ratio (bounding box) and the maximum routing length used in the X and Y directions within that block. Valid values for "bbox" are: WIDE, TALL, SQUARE or #Y#, e.g., X12Y14. In FIG. 3A, the bounding box surrounding each instance of a "srmll" block is constrained to be "WIDE". The general attribute "rtmax" is of the form X#Y#. However, in FIG. 3A, the "srmll" blocks are constrained to use interconnects within the block which are at most one unit long.

Additional parameters used by the example are shown in FIG. 3B as part of the architectural definition of the "srmll" block defined in FIG. 3A. The first attribute of FIG. 3B indicates that the multiplier slice named "mul" is placed at a relative location compared to other elements in the block. The multiplier slice is placed at "X1Y1", i.e., offset one unit in both the horizontal and vertical directions from the origin of the block. The placement of the multiplier slice is independent of the parameters used to create the instance of the "srmll" block. On the contrary, although the adder is placed relatively to the other components (including the multiplier slice), the relative location of the adder in the vertical direction is dependent on the data size of the FIR filter, i.e., based on the number of bits of data filtered by the FIR filter. Similarly, the "bdel" unit is offset by one unit horizontally from the adder. It is also valid to specify a relative position based on a particular PORT by using the syntax "PORT_[BTLR]", where one of B, T, L, and R is chosen to follow "PORT_" depending on whether the definition is based on the bottom, top, left or right, respectively, of the port. The last attribute of FIG. 3B is the "flatten" attribute associated with the flip-flops generated in the gi:GENERATE statement. This specifies that the flip-flops are to be flattened, i.e., grouped together by superimposing their layouts; to remove unused logic elements in a "srmll" block.

FIGS. 3C and 3D show how the general definition of FIGS. 3A and 3B can be extended with further parameterized information using a tap placement parameter, p. Rather than having to build into the library the location of each possible tap for each FIR filter, the position of the taps can be expressed as a function of the desired tap position. It was determined empirically that in the present design a "srmll" block is six logic elements wide on a XC6216. Given that the XC6216 is 64 logic elements wide, there can be at most 10 "srmll" blocks across a band of the logic array. Depending on the number of data bits to be filtered by the FIR filter, a varying number of bands of "srmll" blocks can be placed in the array. According to the example of FIG. 3D, a designer has decided for his/her design that the FIR filter is not the only circuit to be placed in the XC6216, so the designer has chosen the "rloc" equation to avoid the corner corresponding to the highest numbered row and the lowest numbered column. Also, in light of additional routing concerns, the "rloc" attribute of the tap of the FIR filter constrains the tap to be positioned only at rows 0, 16, 32 and 48.

Figure 4A:
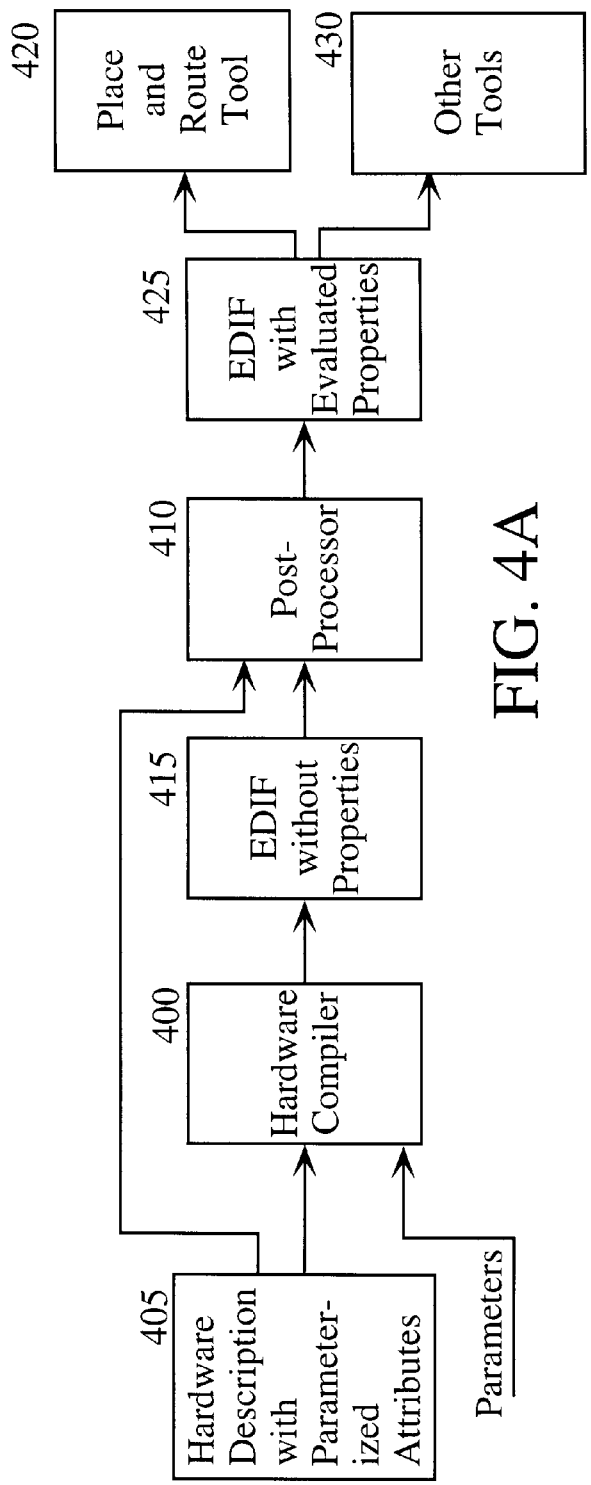
FIGS. 4A and 4B are block diagrams of the interrelationship between tools used by the method of the invention.

FIG. 4A shows the relationship between tools used at various stages in the design method of the present invention. A hardware description file 405 that includes parameterized attributes, such as a VHDL file corresponding to FIG. 3A, is read by a hardware compiler 400, such as DesignWare by Synopsys. The hardware compiler 400 generates an EDIF 415 from the hardware description file 405, but the EDIF 415 does not contain any properties corresponding to parameterized attributes. The EDIF 415 does, however, include cell definitions for each of the cells generated by the hardware compiler 400.

The present invention then post-processes the cell instances generated by the hardware compiler 400 which are stored in the EDIF 415. The post-processor can be either a compiled or an interpreted program, but in the preferred embodiment the post-processor is implemented as a Perl script executed by a Perl interpreter. Perl is advantageous because of its compact but powerful pattern matching functions. To post-process the EDIF 415, the post-processor 410 must also read the attributes from the original hardware description file 405. The post-processor 410 parses and identifies the attributes in the hardware description file 405 and maintains scope information on which attributes affect which types of cell instances. The post-processor 410 then reads the EDIF 415 and searches for cell instances which have attributes to be converted into properties. To determine which cell instances require attributes to be converted, the post-processor parses the grammar of the declarations in the hardware description file 405 in the same way that a C++ compiler would parse a C++ computer programming language program. For ease of understanding, each ENTITY can be thought of as an object (e.g., a C++ object) with a set of interfaces. The simplest objects are defined first and act as a basis for more complex objects. In FIG. 3A, the interface definition of a "srmll" block is given, including the attributes "bbox" and "rtmax". Based on the interface, the implementation (i.e., architecture) of a "srmll" block is given. This implementation includes definitions for additional building blocks including "mult", "seradd", "fdc", and "fdcp", and further includes signals/connections between the building blocks. The signals, shown in FIG. 3B, include "bout", "z", "feedback1", and "feedback2". The post-processor reads in the "rloc" attributes for cells "mul", "add", and "bdel" and for cells generated using generator variable "gi". As a C++compiler would track class definitions and implementations, the post-processor 410 tracks the interface and implementation of each cell. Part of the information tracked is the scope of each variable so that the post-processor 415 may determine the scope of an attribute when it is applied. From the definition of a "srmll" block, FIG. 3C defines an interface and an implementation of a "srmllp" block which includes a "srmll" block defined in FIG. 3A, but also includes the "rloc" placement information defined in FIG. 3D.

After the interface and implementation information has been analyzed by the post-processor 410, the post-processor then analyzes the EDIF 415 to determine which cell instances need to have properties added based on the parameterized attributes of the hardware description file 405. The post-processor 410 does this by looking for root names of cell instances for which it has found attributes. The suffix to the name indicates the parameters used when instantiating the cell instance. For example, in code 500 of FIG. 5A, the cell named "srmll_n8_n_taps5_coeff33" is an instance of a "srmll" block that was instantiated with n=8, n_taps=5 and coeff=33. Generally this syntax can be described as: root_firstvar#_secondvar#, where the number of variables is equal to the number of variables used to instantiate the instance. It should be noted that when using this syntax, to prevent interpreting part of the variable name as its invocation parameter, variable names cannot include numbers. Likewise, a hardware compiler 400 may shorten a name to remove instantiation parameters when the first instance of a cell is created. In cases such as these where a cell is generated/instantiated inside a series of generate loops, the first instance will be labeled "root", and the subsequent instances have a label of the form "root_#_#_#" where there are as many numbers as there are loops in the series.

In the example, if the post-processor 410 determines that attributes exist for "srmll" blocks—which they do—then the properties are added, based on the scope of the attributes, as the cell instance is parsed. During the addition, the parameters used to instantiate the cell instance are also substituted into the parameterized attribute before writing the attribute to an augmented EDIF. For example, in the case above of "srmll_n8_n_taps5_coeff33", variable "n" would be replaced by 8, variable n_taps would be replaced by 5, and variable coeff would be replaced by 33. The entire resulting expression would then be reduced to its simplest form. The result is an augmented EDIF or an EDIF with evaluated parameters 425. This EDIF with evaluated parameters 425 can then be used as an input to a place and route tool 420 or other tools 430. When the EDIF with evaluated parameters 425 is applied to a place and route tool 420 before joining with other components of a design, routing time is reduced by limiting the initial routing to inter-related components.

Figure 4B:
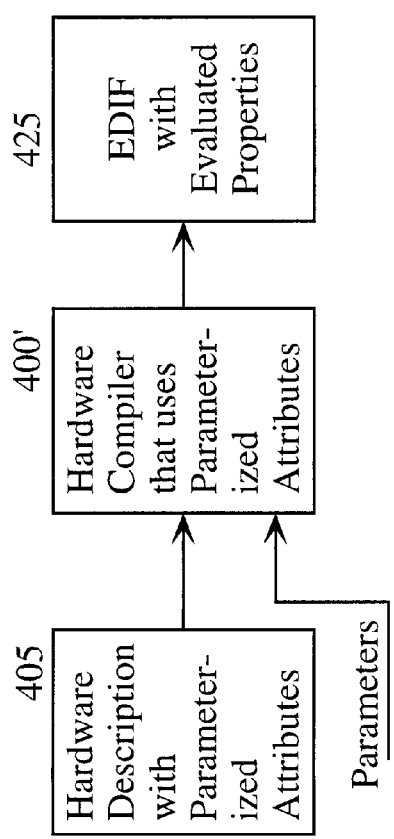

Although the above has been described in terms of a post-processing tool which utilizes an EDIF output 415 from a hardware compiler 400 to generate an augmented EDIF 425, the present invention also encompasses an integrated hardware compiler tool 400' that converts a hardware description file 405 directly into an augmented EDIF file with parameterized properties 425 as shown in FIG. 4B.

As an example of the method of the present invention, it will be described with reference to FIGS. 5A through 5D how two serial multiplier slices described by FIGS. 3A through 3D are created. A user chooses to have two serial multiplier slices created or instantiated. The first serial multiplier slice is created using n=8, n_taps=5 and coeff=33, and the second serial multiplier slice is created using n=8, n_taps=5 and coeff=44. For the first serial multiplier slice, a slice is also specified at p=3, and for the second serial multiplier slice a slice is specified at p=4. Together the parameters and the library with parameterized attributes are applied to the hardware compiler 400. If the bold section of FIGS. 5A through 5D were absent, then FIGS. 5A through 5D would show the EDIF 415. However, without the bold sections, FIGS. 5A through 5D would not include any properties, only cell instances and network routing information. (For clarity, the network information has been removed and instead a list has been provided which is a general description of which network routes are actually created.) The EDIF 415 and the hardware description file 405 are then both parsed and analyzed by the post-processor 410. The result of the post-processing is the EDIF with evaluated properties 425 shown in FIGS. 5A through 5D, including the sections shown in bold. As can be seen in FIG. 5A, post-processor 410 finds a cell instance "srmll_n8_n_taps5_coeff33". When the cell "add" of this "srmll" block is found, the post-processor 410 then substitutes the instantiation variable into the general equation for "rloc" of "add". Thus, "X4Y,n+1," is converted to "X4Y9". The "rloc" attributes for "bdel" and the "srmllp" blocks are processed analogously. FIG. 5B shows in code 505 that the third placed slice is placed at a relative location of "X12Y0". In addition, as shown in code 510 of FIG. 5C, post-processor 410 finds a cell instance "srmll_n8_n_taps5_coeff44". Also, as shown in code 515 of FIG. 5D, post-processor 410 finds a cell instance "srmll_n8_n taps5_coeff44_p4" which has an "rloc" of "X18Y0".

Figure 6:
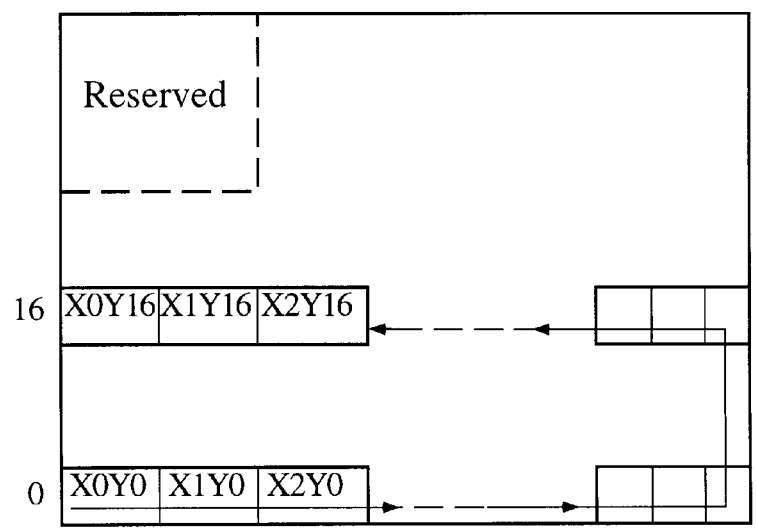
FIG. 6 is a schematic illustration of a mapping of high-level components onto logic elements, wherein the logic elements are assigned in a serpentine order.

Continuing with another example, FIG. 6 shows the layout of an entire FIR filter if 20 taps are used in a FIR filter which filters less than eleven bits of data. According to the equation given for "rloc" of "srml", since "p" is less than 11, then for the whole first band (i.e., for the first 10 taps), the "Y" component of "rloc" is set to 0, and the "X" components are set according to: X=6*(p-1). Therefore, the first 10 taps are placed at X0Y0, X6Y0, X12Y0, X18Y0, X24Y0, X30Y0, X36Y0, X42Y0, X48Y0, and X54Y0. The second band of taps however circles back and begins near the end of the first band. Since "p" is no longer less than 11 but is still less than 21, the "Y" component of "rloc" is set to Y=16. The "X" components of the remaining 10 taps are set according to: X=(63−(6*(p−10))). Therefore, the last 10 taps are placed at X57Y16, X51Y16, X45Y16, X39Y16, X33Y16, X27Y16, X21Y16, X15Y16, X9Y16, and X3Y16.

The ability to parameterize the attribute strings using VHDL code variables provides enhanced routing capabilities and enables the pre-placement of generic library components from their high level description. Advantageously, the libraries have enhanced functions which can be closely tied to a particular architecture.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

We claim what is new and desired to be secured be Letters Patent is:

1. A computer program product, comprising:
   a computer storage medium and a computer program code mechanism embedded in the computer storage medium for causing a computer to link a hardware description to an integrated circuit layout, the computer program code mechanism comprising:
   a first computer code device configured to read parameterized attributes from a hardware description file;
   a second computer code device configured to read cell instances from an original EDIF that does not contain hardware properties; and
   a third computer code device configured to generate an augmented EDIF with evaluated hardware properties based on the parameterized attributes read by the first computer code device and the cell instances read by the second computer code device.

2. The computer program product as claimed in claim 1, further comprising a fourth computer code device configured to route the augmented EDIF.

3. The computer program product as claimed in claim 1, wherein one of the parameterized attributes is an attribute which is evaluated according to instantiation parameters of a corresponding one of the cell instances.

4. The computer program product as claimed in claim 1, wherein one of the parameterized attributes is an attribute which is evaluated according to instantiation parameters of a corresponding one of the cell instances, wherein the instantiation parameters are encoded into respective names of the cell instances in the original EDIF.

5. The computer program product as claimed in claim 1, wherein one of the parameterized attributes is an attribute which is evaluated mathematically according to instantiation parameters of a corresponding one of the cell instances.

6. The computer program product as claimed in claim 1, wherein one of the parameterized attributes is an attribute which is evaluated using text substitution according to instantiation parameters of a corresponding one of the cell instances.

7. The computer program product as claimed in claim 1, wherein one of the parameterized attributes is a relative location attribute for controlling placement of a corresponding one of the cell instances.

8. The computer program product as claimed in claim 1, wherein one of the parameterized attributes is a bounding box attribute for controlling routing of a corresponding one of the cell instances.

9. A computer program product, comprising:
   a computer storage medium and a computer program code mechanism embedded in the computer storage medium for causing a computer to link a hardware description to an integrated circuit layout, the computer program code mechanism comprising:
   a first computer code device configured to read a hardware description file including parameterized attributes; and a second computer code device configured to generate an augmented EDIF with evaluated hardware properties based on the parameterized attributes read by the first computer code device.

10. The computer program product as claimed in claim 9, further comprising a third computer code device configured to route the augmented EDIF.

11. The computer program product as claimed in claim 9, wherein one of the parameterized attributes is an attribute which is evaluated according to instantiation parameters of a corresponding one of the cell instances.

12. The computer program product as claimed in claim 9, wherein one of the parameterized attributes is an attribute which is evaluated mathematically according to instantiation parameters of a corresponding one of the cell instances.

13. The computer program product as claimed in claim 9, wherein one of the parameterized attributes is an attribute which is evaluated using text substitution according to instantiation parameters of a corresponding one of the cell instances.

14. The computer program product as claimed in claim 9, wherein one of the parameterized attributes is a relative location attribute for controlling placement of a corresponding one of the cell instances.

15. The computer program product as claimed in claim 9, wherein one of the parameterized attributes is a bounding box attribute for controlling routing of a corresponding one of the cell instances.

16. A computer-implemented method comprising the steps of:

reading parameterized attributes from a hardware description file into a computer memory;

reading into the computer memory cell instances from an original EDIF that does not contain hardware properties; and generating an augmented EDIF with evaluated hardware properties based on the parameterized attributes and the cell instances read into the computer memory.

17. The method as claimed in claim 16, further comprising the step of:

routing the augmented EDIF.

18. A computer-implemented method comprising the steps of:

reading into a computer memory a hardware description file including parameterized attributes; and generating an augmented EDIF with evaluated hardware properties based on the parameterized attributes read into the computer memory.

19. The method as claimed in claim 18, further comprising the step of:

routing the augmented EDIF.

* * * * *